(12) United States Patent
Mehrmanesh et al.

(10) Patent No.: US 8,576,008 B2
(45) Date of Patent: Nov. 5, 2013

(54) RADIO FREQUENCY SIGNAL GAIN CONTROL

(75) Inventors: Saeid Mehrmanesh, San Jose, CA (US); Vahid Mesgarpour Toosi, Mountain View, CA (US)

(73) Assignee: SiTune Corporation, San Jose, CA (US)

( * ) Notice: Subject to any disclaimer, the term of this patent is extended or adjusted under 35 U.S.C. 154(b) by 0 days.

(21) Appl. No.: 13/293,504

(22) Filed: Nov. 10, 2011

(65) Prior Publication Data

US 2013/0120068 A1 May 16, 2013

(51) Int. Cl.
*H03G 3/30* (2006.01)
(52) U.S. Cl.
USPC .............................. 330/282; 330/301; 330/283
(58) Field of Classification Search
USPC ................. 330/283, 301; 333/25–26
See application file for complete search history.

(56) References Cited

U.S. PATENT DOCUMENTS 7,671,686 B2 * 3/2010 Kuo et al. ..................... 330/301
7,760,028 B2 * 7/2010 Sanduleanu et al. .......... 330/301

* cited by examiner

*Primary Examiner* — Hieu Nguyen
(74) *Attorney, Agent, or Firm* — Novak Druce Connolly Bove + Quigg LLP

(57) ABSTRACT

An RF receiver is described comprising a common gate common source LNA with a variable resistor in the source of the common gate transistor, a variable resistor in the source of the common source transistor, and a variable resistor in the RF input. A Smart Gain Control varies the resistance in the resistors to produce linear amplification in the LNA while maintaining input matching. Further, a broad dynamic range RSSI is described that implements a feedback control loop to maintain signal power within a sensitivity range of the power detector in the RSSI.

12 Claims, 8 Drawing Sheets

US 8,576,008 B2

RADIO FREQUENCY SIGNAL GAIN CONTROL

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates generally to the field of radio frequency receivers, and more specifically to amplification of signals in the radio frequency section of receivers.

BACKGROUND

Telecommunications has been among the fastest growing technologies of this century. Communication devices such as cell phones, PDAs, mobile televisions, personal navigation devices, personal media players, and a myriad others are becoming increasingly commonplace in modern society. Accordingly, the performance requirements of communications systems are increasing at a staggering pace. Today, these devices are under pressure to perform reliably and offer vast capabilities while maintaining a competitive price point.

The receiver is a critical component in a communication device's performance and cost. The receiver's function is to receive an often significantly distorted and attenuated signal and convert it into a signal that can be used by other components in the system. The quality of the signals produced by the receiver is a limiting factor in the performance of communications systems and manufacturers continuously strive to improve this aspect of receiver design.

One of the functions of the receiver is to amplify an incoming signal such that the gain of the signal is appropriate for other components in the system. However, the power of signals received at a receiver can vary significantly. Namely, due to attenuation, a signal's power declines as the signal travels away from the transmitter. For example, a signal sent to a receiver through the air may have significantly lower power further from the transmitter than close to it. The difference in power can be in the order of several magnitudes. Hence, a device in a traveling vehicle, for instance, may observe severe fluctuation in incoming signal power as it travels from the proximity of one radio tower into the proximity of another radio tower. As a result, the receiver must be able to amplify incoming signals in a broad power range to produce signals with desired gain and other desirable characteristics.

Existing devices apply a single amplification routine to all incoming signals. However, such systems result in a trade-off between signal noise and distortion with weak incoming signals producing noise and strong incoming signals producing distortion. What is needed is an RF receiver that processes incoming signals in a broad range of power and minimizes noise and distortion for signals across the range. As will be demonstrated, this invention performs this in an elegant manner.

DETAILED DESCRIPTION

Figure 1:
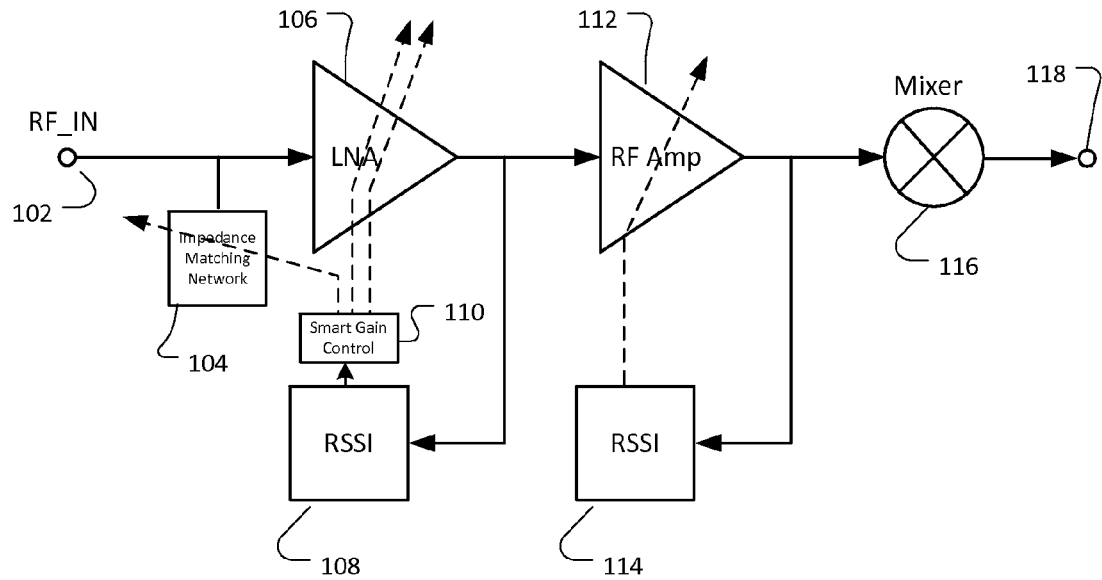
FIG. 1 illustrates an example of a radio frequency receiver in accordance with various embodiments.

In the following description, numerous specific details are set forth in order to provide a thorough understanding of the present invention. However, it will be apparent to one skilled in the art that the present invention can be practiced without these specific details. In other instances, well known circuits, components, algorithms, and processes have not been shown in detail or have been illustrated in schematic or block diagram form in order not to obscure the present invention in unnecessary detail. Additionally, for the most part, details concerning communications systems, transmitters, receivers, communications devices, various components of such systems, and the like, have been omitted inasmuch as such details are not considered necessary to obtain a complete understanding of the present invention and are considered to be within the understanding of persons of ordinary skill in the relevant art. It is further noted that, where feasible, all functions described herein may be performed in either hardware, software, firmware, analog components or a combination thereof, unless indicated otherwise. Certain terms are used throughout the following description and Claims to refer to particular system components. As one skilled in the art will appreciate, components may be referred to by different names. This document does not intend to distinguish between components that differ in name, but not function. In the following discussion and in the Claims, the terms "including" and "comprising" are used in an open-ended fashion, and thus should be interpreted to mean "including, but not limited to . . . ."

Embodiments of the present invention are described herein. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with applications and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In various embodiments, systems and methods are described for processing a radio frequency (RF) signal. The described systems and methods can be used to process radio frequency signals in a radio frequency receiver of a variety of devices. Radio frequency integrated chips, such as CMOS chips, are used widely in implementations that involve different frequencies, standards, and applications. A common problem in all integrated chip designs is handling of both very small and very large signals due to a trade-off between noise and linearity with weak signals exhibiting noise problems and large signals exhibiting distortion problems.

Because the input signals in an RF system can have a broad dynamic range, a gain control system can be implemented to adjust signal gain. Hence, the signal power can be measured and the gain in the system can be adjusted based on the measured signal power to control signal gain and other parameters of the RF circuits. For very low frequency signals, the main problem of RF-circuits is noise. But for large input signals, the main problem becomes linearity and distortion. For the best performance, the circuit can be tuned for either noise performance or linearity performance depending on the properties of the received signal.

Received Signal Strength Indicators ("RSSIs") can be used to measure signal power in a gain control system. There are several common problems in RF RSSI circuits, Wide-range input signals, process variation, offset errors, and temperature changes are some concerns for RF RSSI circuits and should be overcome to achieve optimal performance of the gain control system.

FIG. 1 illustrates an example of a radio frequency receiver in accordance with various embodiments. A radio frequency signal can be received at the input 102 "RF_IN." The signal can be conveyed to the input from an antenna, a wire medium such as cable, or other input method. From the input 102, the signal can be conveyed to an impedance matching network 104 "Impedance Matching Network," for matching impedance of the input and optimizing the S11 parameter, The signal can be conveyed to a first low-noise amplifier 106 "LNA." After the first LNA 106, the signal can be conveyed to a Received Signal Strength Indicator 108 "RSSI." The RSSI 108 can measure the power of the signal and convey a control signal based on the measured power to a Smart Gain Control 110 "Smart Gain Control." Based on the control signal, the Smart Gain Control 110 can convey control signals to the impedance Matching Network 104 and the LNA 106 to adjust the Impedance Matching Network 104 and the LNA 106. Hence, a gain control system comprising an LNA 106, an RSSI 108, a Smart Gain Control 110, and an Impedance Matching Network 104, can form a feedback loop that can control the gain of the system and the matching of input impedance based on the input signal and adjacent channel conditions. The Impedance Matching Network feedback loop can optimize the S11 parameter for various signal conditions. The signal can be conveyed to an RF amplifier 112 "RF Amp" for further amplification. After the amplifier, the signal can be conveyed to a second RSSI 114. The RSSI 114 can measure the power of the signal and convey a control signal to the RF Amp 112 to adjust the gain in the RF amp 112 based on the measured signal power. The signal can be conveyed to a Mixer 116 for frequency conversion to a low frequency and the low frequency signal can be conveyed to the output 118.

Figure 2:
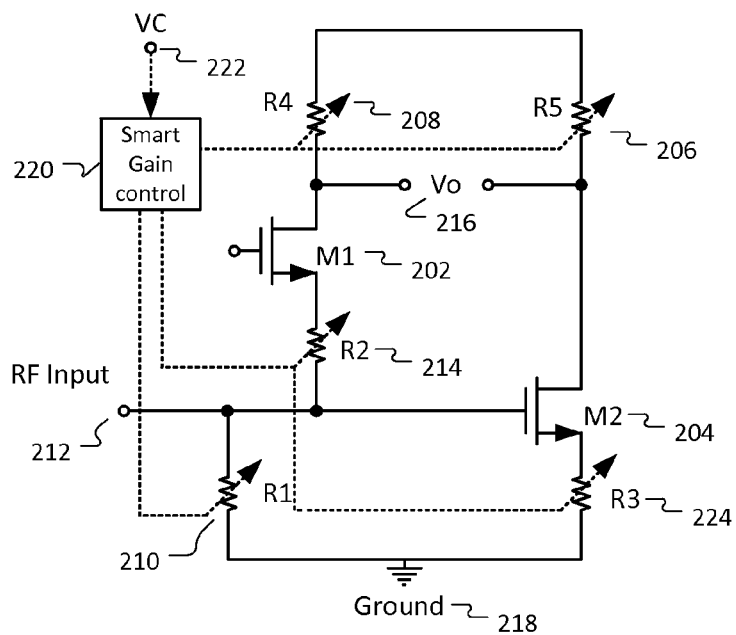
FIG. 2 illustrates an example of a common gate common source LNA incorporating an Impedance Matching Network in accordance with various embodiments.

FIG. 2 illustrates an example of a common gate common source LNA incorporating an Impedance Matching Network in accordance with various embodiments. In various embodiments, the LNA can contain a common gate amplifier and a common source amplifier. The common gate amplifier can comprise a common gate transistor M1 202, such as a CMOS transistor, and a variable resistor R4 208 in the drain of the common gate transistor M1 202. The common source amplifier can comprise a common source transistor M2 204, such as a CMOS transistor, and a variable resistor R5 206 in the drain of the common source transistor M2 204. The LNA can further comprise a variable resistor R2 214 in the source of the common gate transistor 202 and a variable resistor R3 224 in the source of the common source transistor M2 204. In various embodiments, the LNA can contain a variable resistor R1 210 in the RF input. A Smart Gain Control 220 can be electronically connected to the variable resistors R1 210, R2 214, R3 224, R4 208, and R5 206 and convey control signals to the variable resistors R1 210, R2 214, R3 224, R4 208, and R5 206 to vary the resistance in the variable resistors R1 210, R2 214, R3 224, R4 208, and R5 206 based on a control voltage VC 222 conveyed to the Smart Gain Control 220.

In various embodiments, the system illustrated in the example of FIG. 2 can be implemented as the Impedance Matching Network 104, LNA 106, and Smart Gain Control 110 of the system described in the example of FIG. 1.

The common source amplifier and the common gate amplifier can work together to cancel noise and deliver differential outputs. An obstacle to achieving good performance for integrated circuits, such as regular CS-CG integrated circuits, is that the Gm for the common gate transistor, such as the M1 202 transistor in the example of FIG. 2, is fixed based on S11 requirements. To improve linearity, this system uses resistors R2 214 and R3 224 as degeneration resistors. However, this can have a negative effect on S11 of the input. To resolve the input matching issue, the resistor R1 210, can be used to bring S11 back to normal conditions. This LNA can also use a load control system that works towards limiting the swings for high signal conditions. As illustrated in the example of FIG. 2, the control signal, VC 222, can be conveyed to a Smart Gain Control 220. The control signal VC 222 can be conveyed from an RSSI, such as the RSSI 108 illustrated in the example of FIG. 1. VC 222 can correspond to a power of an RF signal in the system. Based on the control signal VC 222, the Smart Gain Control 220 can convey a first control signal to resistor R1 210 to adjust a resistance in R1 210, a second control signal to resistors R2 214 and R3 224 to adjust a resistance in resistors R2 214 and R3 224, and a third control signal to resistors R4 208 and R5 206 to adjust a resistance in resistors R4 208 and R5 206. RF Input 212 can be the input for the RF signal to the LNA, Vo 216 can be a differential output, and "Ground" 218 can be a ground.

To change the gain of the LNA, and achieve the best noise and linearity performance, the variable resistors R2 214 and R3 224 can be placed in the source of the common gate transistor M1 202 and the common source transistor M2 204, respectively. By changing the resistance of the resistors R2 214 and R3 224, the LNA gain can be changed; also, by adding these resistors, the linearity performance or the LNA can be improved for large input signals. By adding the variable resistor R2 214 in the source of the common gate transistor M1 202, the input impedance can be affected, affecting the input impedance matching performance. The variable resistor R1 210 can be added to the input to compensate input impedance performance. The resistance of the input resistor R1 210 can be decreased when the resistance of the source resistors R2 214 and R3 224 is increased to compensate input impedance performance. Also, more gain attenuation can be achieved by decreasing the resistance of the drain resistors R4 208 and R5 206. The Smart Gain Control 220 can be configured to adjust the resistance in the variable resistors R1 210, R2 214, R3 224, R4 208, and R5 206 to optimize linearity performance and impedance matching while changing the level of amplification in the LNA.

In the example of FIG. 2, changing the resistance of resistors R4 208 and R5 206 can change the gain of the LNA without affecting other aspect of circuit performance. Changing the resistance of resistors R2 214 and R3 224 can have the effect that more gain will be achieved with lower resistance in R2 214 and R3 224 and higher gain will be achieved with higher resistance in R2 214 and R3 224. Further, increasing the resistance on R2 214 and R3 224 can have the effect of more linear performance. When the resistance on resistors R2 214 and R3 224 is changed, input impedance can be affected. To counteract the effect on input impedance by changes in the resistance of resistors R2 214 and R3 224, a corresponding change in the resistance of resistor R1 210 can be made. The example of FIG. 2 can be implemented as the LNA 106 and Impedance Matching Network 104 of FIG. 1.

The gain of the LNA demonstrated in FIG. 2 can be approximated by the formula:

$$\text{Gain} = \frac{R4}{R2 + 1/Gm(M1)} + \frac{R5}{R3 + 1/Gm(M2)},$$

where R2, R3, R4, and R5 are the resistances of the corresponding variable resistors R2 214, R3 224, R4 208, R5 206, Gm(M1) is the Gm of M1 202, and Gm(M2) is the Gm of M2 204. Hence, increasing the resistance of R4 208, and R5 206 can increase the gain of the LNA and increasing the resistance of R2 214 and R3 224 can decrease the gain of the LNA. However, when the resistance of the resistors R4 208 and R5 206 becomes low, there can be a negative effect on linearity performance. Thus, it can be favorable for linearity performance to achieve low levels of amplification by increasing the resistance of the resistors R2 214 and R3 224 instead of decreasing the resistance of the resistors R1 208 and R5 206.

Thus, the Smart Gain Control 220 can receive a control signal VC 222, such as a control signal from an RSSI, and adjust the gain of the LNA by varying the resistance in the variable resistors R2 214, R3 224, R4 208, and R5 206 of the LNA according to executable logic circuits in the Smart Gain Control 220. In an embodiment, the Smart Gain Control 220 can contain analog circuits to implement the executable logic.

The impedance matching network 104, and LNA 106 illustrated in the example of FIG. 1 can comprise the LNA described in FIG. 2; the Smart Gain Control 110 illustrated in the example of FIG. 1 can comprise the Smart Gain Control 220 described in FIG. 2; and the control signal VC 222 illustrated in the example of FIG. 2 can be conveyed from an RSSI, such as the RSSI 108 illustrated in the example of FIG. 1.

Figure 3:
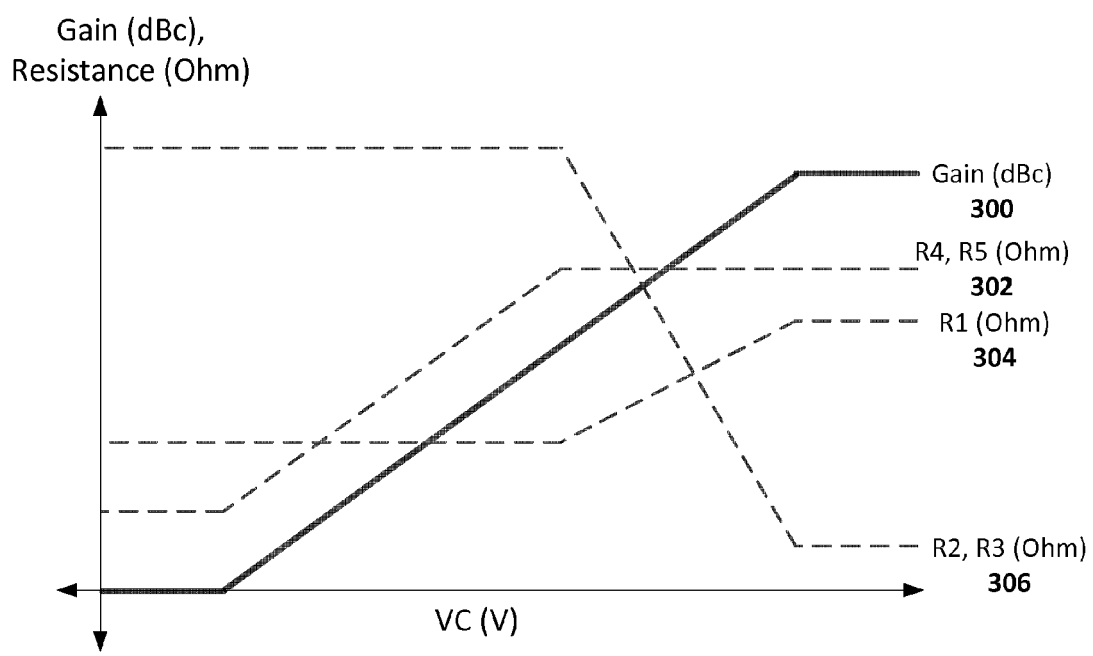
FIG. 3 illustrates a graph that demonstrates an example of executable logic contained in a Smart Gain Control, in accordance with various embodiments.

FIG. 3 illustrates a graph that demonstrates an example of executable logic contained in a Smart Gain Control, in accordance with various embodiments. In the example of FIG. 3, the horizontal axis represents the control signal, in volts, ("VC(V)") that is conveyed to the Smart gain control 110 from the RSSI 108. For example, the control signal can be the control signal VC 222 conveyed to the Smart Gain Control 220 illustrated in the example of FIG. 2; or the control signal conveyed to the Smart gain control 110 from the RSSI 108 illustrated in the example of FIG. 1. The vertical axis represents the gain in decibels (dBc) of the LNA, such as the LNA illustrated in FIG. 2 or the LNA 106 and impedance matching network 104 illustrated in FIG. 1. The vertical axis also represents the resistance in Ohms of variable resistors R1, R2, R3, R4, and R5. For example, the resistance values can correspond to the variable resistors in an LNA such as the variable resistors R1 210, R2 214, R3 224, R4 208, and R5 206 illustrated in the example of FIG. 2. The solid line in the graph 300 ("Gain (dBc)") represents the gain of the LNA in decibels (dBc), and the dashed lines 304 ("R1 (Ohm)"), 306 ("R2, R3 (Ohm)") and 302 ("R4, R5 (Ohm)") represent the resistance of the resistors R1, R2, R3, R4, and R5 in Ohms.

As illustrated in the example of FIG. 3, the gain 300 can increase as the control voltage VC increases. When the control voltage is at a minimum, R2 and R3 can be at a maximum resistance, R4 and R5 can be at minimal resistance, and R1 can be at a minimal resistance. As described above, the resistance of R1 can be selected based on the resistance of R2 to maintain desirable input impedance, for example, to maintain input impedance of 50 ohms or 75 ohms. Hence, when R2 is constant, R1 can be constant as well. As the control voltage is increased, the gain can be initially increased only by increasing the resistance in R4 and R5. When the resistance in R4 and R5 reaches a maximum, further increase in gain can be achieved by reducing the resistance of R2 and R1. Hence, to achieve maximum gain, R2 and R3 can be reduced to a minimum resistance, and R4 and R5 can be at a maximum resistance. As further illustrated, to compensate for the effect on input impedance, the resistance of R1 can be increased as the resistance in R2 and R3 is decreased. In various embodiments, the reference to a "maximum" or "minimum" level of resistance for any given resistor, such as the resistors R1, R2, R3, R4, and R5 can refer to a pre-selected maximum and minimum level that is chosen based on performance characteristics of the respective resistor and/or the circuit containing the resistor.

As will be apparent to a person skilled in the art, the graph of FIG. 3 is provided for the purposes of illustration and other schemes and routines for varying resistance levels in variable resistors of the described LNA to achieved desirable performance are possible without straying from the spirit of the invention. Accordingly, as will be apparent to one skilled in the art, in various embodiments, the executable logic contained in a Smart Gain Control can be configured to adjust the resistance in the resistors R1 through R5 according to different patterns than illustrated in the example of FIG. 3 to achieve desired performance parameters such as linearity, gain, and noise levels.

Figure 4:
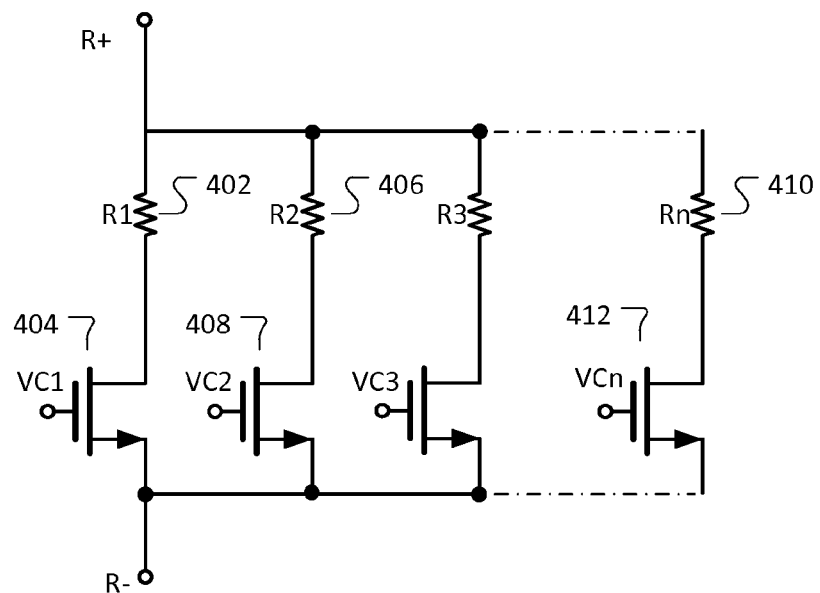
FIG. 4 illustrates an example configuration of a variable resistor that can be implemented as the variable resistors R1 201, R2 214, R3 224 illustrated in FIG. 2, in accordance with various embodiments.

FIG. 4 illustrates an example configuration of a variable resistor that can be implemented as the variable resistors R1 210, R2 214, R3 224 illustrated in FIG. 2, in accordance with various embodiments. As illustrated in the example of FIG. 4, a resistor R1 402 can be coupled in series with an n-type transistor VC1 404, such as a CMOS transistor. The resistor R1 402 and transistor VC1 404 series can be coupled in parallel with an n number of similar resistor transistor series, such as the resistor R2 406 and n-type transistor VC2 408 series, all the way to the resistor Rn 410 and n-type transistor VCn 412 series. Control voltages can be conveyed to the transistors VC1 404 through VCn 412 to vary the transistors VC1 404 through VCn 412 and thereby control the resistance of the variable resistor. For example, the control voltages can be conveyed from the Smart Gain Control 220 based on a control voltage 222.

Figure 5:
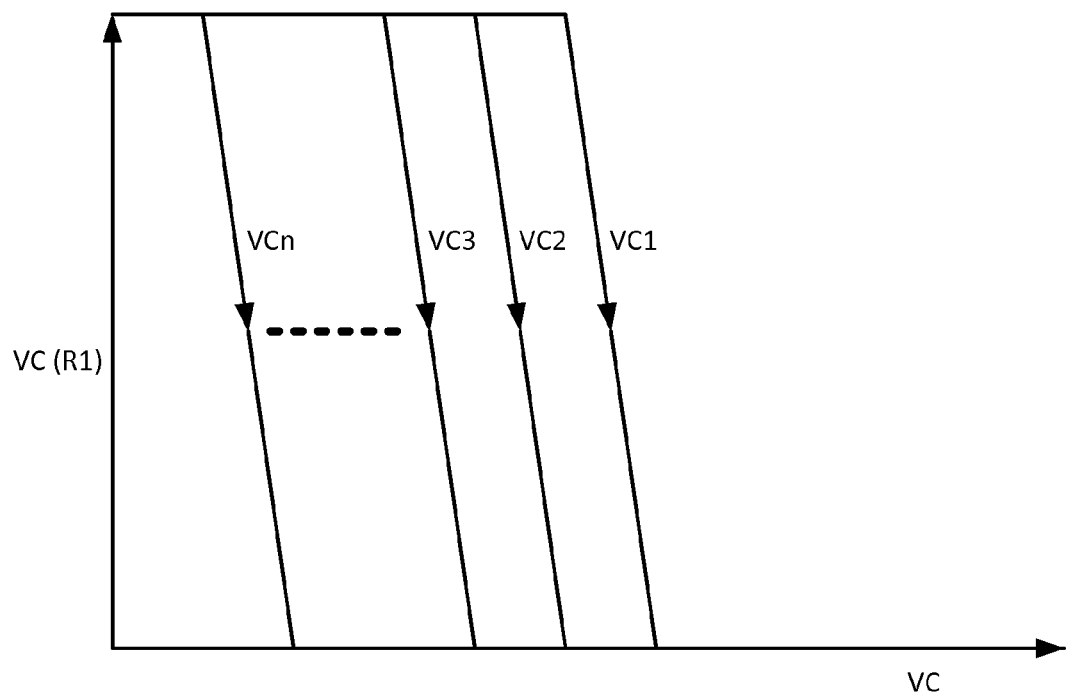
FIG. 5 illustrates an example graph of control signals that can be conveyed to the transistors VC1 404 through VCn 412 of a variable resistor, such as the variable resistor illustrated in FIG. 4, to implement the variable resistor as the variable resistor R1 210 of the LNA illustrated in FIG. 2, in accordance with various embodiments.

FIG. 5 illustrates an example graph of control signals that can be conveyed to the transistors VC1 404 through VCn 412 of a variable resistor, such as the variable resistor illustrated in FIG. 4, to implement the variable resistor as the variable resistor R1 210 of the LNA illustrated in FIG. 2, in accordance with various embodiments. In the example graph of FIG. 5, the horizontal axis represents the control voltage ("VC") 222 that is conveyed to the Smart Gain Control 220. The vertical axis represents the control voltages ("VC(R1)") that can be conveyed by the Smart Gain Control 222 to the individual transistors VC1 404 through VCn 412 in the variable resistor R1 210. As illustrated, when the control voltage VC is at a minimum, maximum control voltage can be conveyed to all transistors VC1 404 through VCn 412, which causes all the transistors to be closed and creates maximum parallel paths for the current to flow, producing minimal resistance in the variable resistor R1 210. As the control voltage VC is increased, the control voltage VCn can be gradually reduced to a minimum, causing the transistor VCn 412 to gradually open and thereby gradually increase the resistance of the variable resistor R1 210. Accordingly, as the control voltage VC continues to increase, the control voltage to all the transistors through VC1 404 can be sequentially decreased to a minimum, eventually producing maximum resistance in the variable resistor R1 210.

Figure 6:
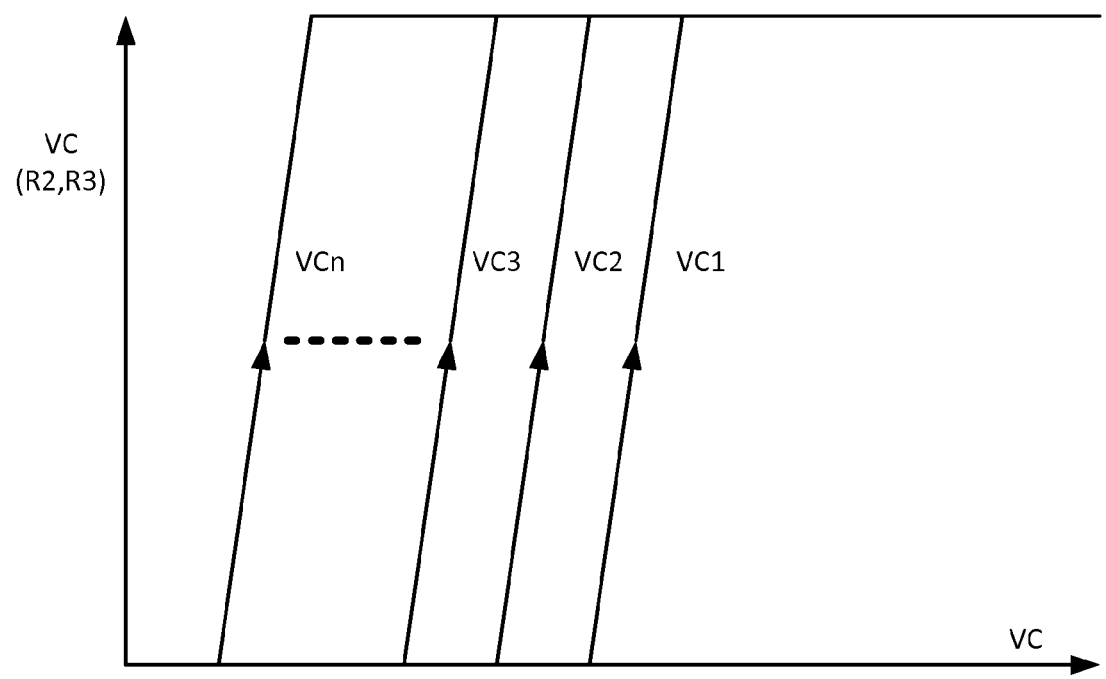
FIG. 6 illustrates an example graph of control signals that can be conveyed to the transistors VC1 404 through VCn 412 of a variable resistor, such as the variable resistor illustrated in FIG. 4, to implement the variable resistor as the variable resistor R2 214 and R3 224 of the LNA illustrated in FIG. 2, in accordance with various embodiments.

FIG. 6 illustrates an example graph of control signals that can be conveyed to the transistors VC1 404 through VCn 412 of a variable resistor, such as the variable resistor illustrated in FIG. 4, to implement the variable resistor as the variable resistor R2 214 and R3 224 of the LNA illustrated in FIG. 2, in accordance with various embodiments. In the example graph of FIG. 6, the horizontal axis represents the control voltage ("VC") 222 that is conveyed to the Smart Gain Control 220. The vertical axis represents the control voltages ("VC(R2, R3)") that are conveyed by the Smart Gain Control 222 to the individual transistors VC1 404 through VCn 412 in the variable resistors R2 214 and R3 224. As illustrated, when the control voltage VC is at a minimum, minimum control voltage can be conveyed to all transistors VC1 404 through VCn 412, which causes all the transistors to be open and creates minimum parallel paths for the current to flow, producing maximal resistance in the variable resistors R2 214 and R3 224. As the control voltage VC is increased, the control voltage VCn can be gradually increased to a maximum, causing the transistor VCn 412 to gradually close and thereby gradually decrease the resistance of the variable resistors R2 214 and R3 224. Accordingly, as the control voltage VC continues to increase, the control voltage to all the transistors through VC1 404 can be sequentially increased to a maximum, eventually producing minimum resistance in the variable resistors R2 214 and R3 224.

Figure 7:
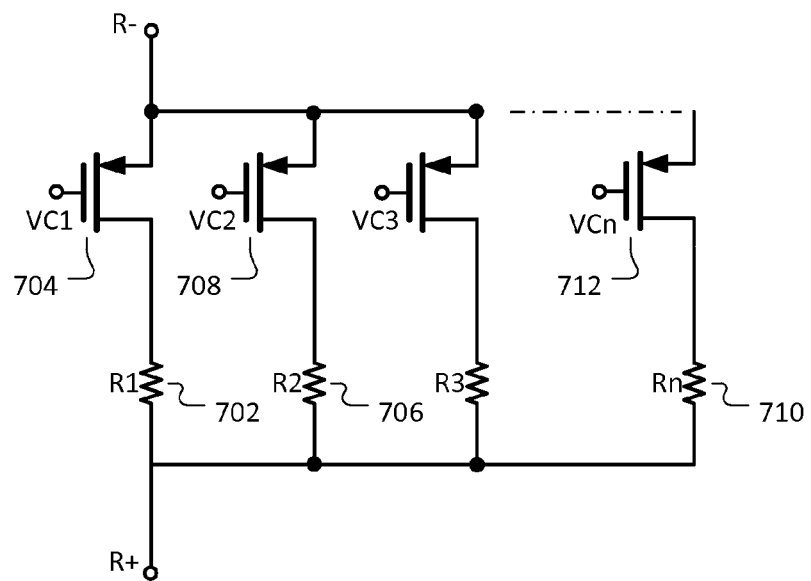
FIG. 7 illustrates an example configuration of a variable resistor that can be implemented as the variable resistors R4 208 and R5 206, illustrated in FIG. 2, in accordance with various embodiments.

FIG. 7 illustrates an example configuration of a variable resistor that can be implemented as the variable resistors R4 208 and R5 206, illustrated in FIG. 2, in accordance with various embodiments. As illustrated in the example of FIG. 7, a resistor R1 702 can be coupled in series with a p-type transistor VC1 704, such as a CMOS transistor. The resistor R1 702 and transistor VC1 704 series can be coupled in parallel with an n number of similar resistor transistor series, such as the resistor R2 706 and p-type transistor VC2 708 series, all the way to the resistor Rn 710 and n-type transistor VCn 712 series. Control voltages can be conveyed to the transistors VC1 704 through VCn 712 to vary the transistors VC1 704 through VCn 712 and thereby control the resistance of the variable resistor. For example, the control voltages can be conveyed from the Smart Gain Control 220 based on a control voltage 222.

Figure 8:
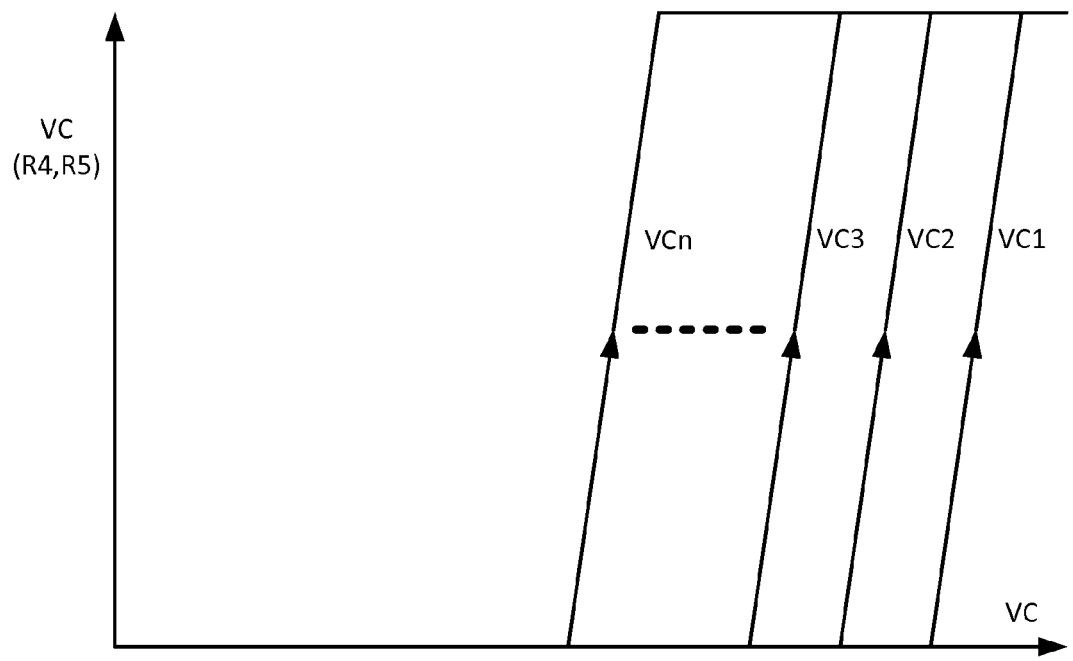
FIG. 8 illustrates an example graph of control signals that can be conveyed to the transistors VC1 704 through VCn 712 of a variable resistor, such as the variable resistor illustrated in FIG. 7, to implement the variable resistor as the variable resistor R4 208 and R5 206 of the LNA illustrated in FIG. 2, in accordance with various embodiments.

FIG. 8 illustrates an example graph of control signals that can be conveyed to the transistors VC1 704 through VCn 712 of a variable resistor, such as the variable resistor illustrated in FIG. 7, to implement the variable resistor as the variable resistor R4 208 and R5 206 of the LNA illustrated in FIG. 2, in accordance with various embodiments. In the example graph of FIG. 7, the horizontal axis represents the control voltage ("VC") 222 that is conveyed to the Smart Gain Control 220. The vertical axis represents the control voltage ("VC (R4,R5)") that is conveyed by the Smart Gain Control 222 to the individual transistors VC1 704 through VCn 712 in the variable resistors R4 208 and R5 206. As illustrated, when the control voltage VC is at a minimum, a minimum control voltage can be conveyed to all transistors VC1 704 through VCn 712, which causes all the transistors to be closed and creates maximum parallel paths for the current to flow, producing minimum resistance in the variable resistors R4 208 and R5 206. As the control voltage VC is increased, the control voltage VCn can be gradually increased to a maximum, causing the transistor VCn 712 to gradually open and thereby gradually increase the resistance of the variable resistors R4 208 and R5 206. Accordingly, as the control voltage VC continues to increase, the control voltage to all the transistors through VC1 704 can be sequentially increased to a maximum, eventually producing maximum resistance in the variable resistors R4 208 and R5 206.

Figure 9:
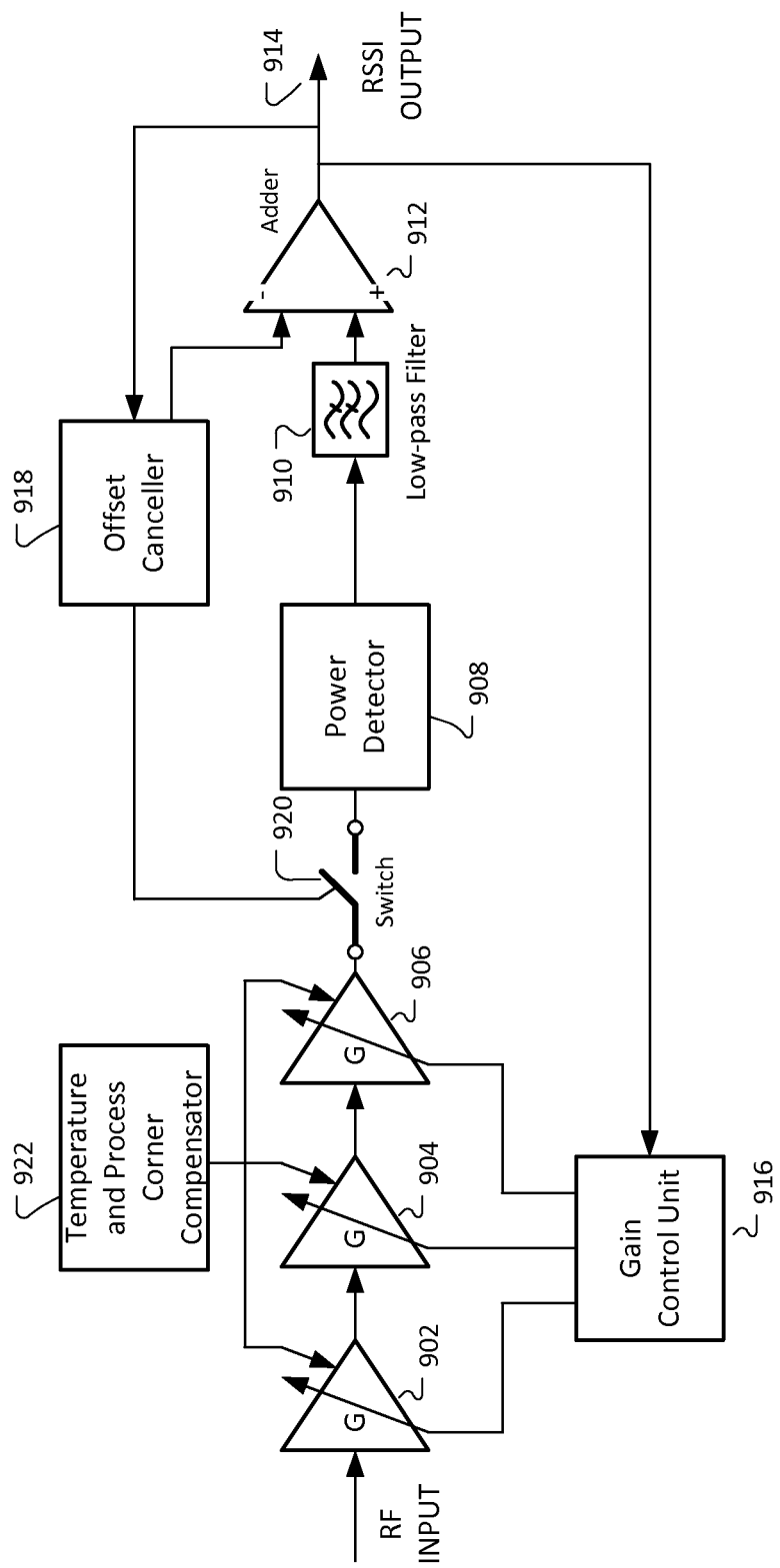
FIG. 9 illustrates an example of an RSSI in accordance with various embodiments.

FIG. 9 illustrates an example of an RSSI in accordance with various embodiments. The RSSI illustrated in the example of FIG. 9 can be implemented as the RSSI 108 and/or RSSI 114 illustrated in FIG. 1. In the example of FIG. 9, the RSSI circuit can consist of three amplifiers 902, 904, 906, such as three wideband fully differential gain stages ("G"), followed by a Power detector 908, "Power Detector." CMOS Power detectors can have poor sensitivity, for example as compared to bipolar Power Detectors, so high gain wideband amplifiers can be used to provide a suitably large gain signal for Power Detector inputs. A low-pass filter 910 can determine the DC-level of the Power Detector 908 outputs. The signal can be conveyed to an adder 912 for offset correction and the produced signal can be conveyed to an RSSI Output 914. From the adder 912, the signal can be conveyed to a Gain Control Unit 916. Based on the received signal, the Gain Control Unit 916 can generate a control signal to adjust the gain in the amplifiers 902, 904, 906. As will be apparent to one skilled in the art, in various embodiments, an RSSI can contain different numbers of amplifiers than illustrated in the example of FIG. 9. For example, the RSSI can contain as few as one amplifier or more than three amplifiers.

An Offset Canceller 918, "Offset Canceller" can be used to calibrate the system. In various embodiments, the Offset Canceller can be digital. Although the signal range is wide, wider signal sensitivity and lower characteristic curve results in more sensitivity of the RSSI output to any offset, error, and technology variations. Another feedback loop can be used to compensate all DC offset components to "calibrate" the RSSI. A switch 920, such as an NMOS switch, can be placed before the Power Detector 908. The switch 920 can be opened to stop RF signals from being conveyed to the Power Detector 908. With no signals going to the Power detector, the signal produced in the RSSI can be measured by an Offset Canceller 918 and a corresponding correction signal can be generated by the Offset Canceller 918 and conveyed to the adder 912 to compensate the offset. The produced corrected signal can then be measured by the Offset Canceller 918 to determine if an offset is correct. While the switch 920 is open, the Offset Canceller 918 can go through several iterations of measuring the offset, correcting the offset with a corrected signal, and measuring the corrected output until a given number of iterations is performed or the offset is sufficiently compensated. With such a switch 920, the input signals are physically grounded and the offset cancelation circuit can compensate DC-errors. This can allow the RSSI to measure very small signals. After removing offset from Low-pass filter outputs, the amplified and buffered signal can be conveyed to the RSSI output. To eliminate offset voltage, a digital circuit and a digital to analog (DAC) circuit can be used. The sign of the offset can be measured with a comparator and it can be compensated by making a reference voltage with the digital to analog circuit (DAC). Once the proper offset is determined, the correction signal produced by the Offset Canceller 918 can be fixed, the switch can be closed, and the fixed correction signal can be added with the signal from the Low-pass Filter 910 in the adder 912 to compensate the offset.

In the example of an RSSI circuit of FIG. 9, the multi stage amplifiers "G" 902, 904, 906 can provide enough voltage gain for detecting the power of small input signals. Because amplifier current sources can be variable, the total gain could be changed sharply with changing current source values. RF amplifiers can be wide-band with resistive load so they are able to amplify signals in different frequency ranges. As will be apparent to one skilled in the art, in various other embodiments, the gain of the amplifiers can be changed by adjusting other parameters, such as resistance in resistors, size of transistors, etc.

in the example of an RSSI circuit of FIG. 9, a Temperature and Process Corner Compensator 922, "Temperature and Process Corner Compensator," can compensate for temperature and process corner errors. The Temperature and Process Corner Compensator can consist of a Temperature Compensator and a Process Corner Compensator. Amplifier gain and Power detector behavior are highly dependent on temperature. To compensate changes in temperature, a reverse temperature dependant circuit can be used. This circuit can change the current value of the amplifiers. By tuning amplifier gain with a Temperature Compensator, the temperature effect on the amplifiers can become negligible. The temperature has effects on characteristic of the chip elements like transistors, diodes and resistors. All the temperature changes can be modeled as a gain change so it can be compensated by changing the gain of the RSSI amplifiers 902, 904, 906. Temperature could be measured with temperature dependent resistors, diodes, or transistors or any combination of those elements. The gain change can be made with amplifier current change. In various embodiments, gain change could be applied by varying any other elements such as resistors and/or transistors in the system.

Circuit components that are made in a fabrication process have an acceptable variation. Amplifiers can have variations in performance, known as Process Corners. By changing the characteristic of the components, the circuit behavior can be controlled. In RSSI circuits, these variations have influence on accuracy of the power measurement. To compensate for amplifier variations, the Process Corner Compensator can apply a signal to the amplifiers 902, 904, 906 to change gain and achieve consistent performance. For example, to compensate for these variations, an active bias circuit and a corner simulator circuit can be used. By applying a measured variation to a preamp 902, 904, 906 gain, the RSSI accuracy can be increased. The gain change can be made possible with amplifier 902, 904, 906 current change. In various embodiments, gain change could be applied by varying other elements, such as resistors and transistors.

Figure 10:
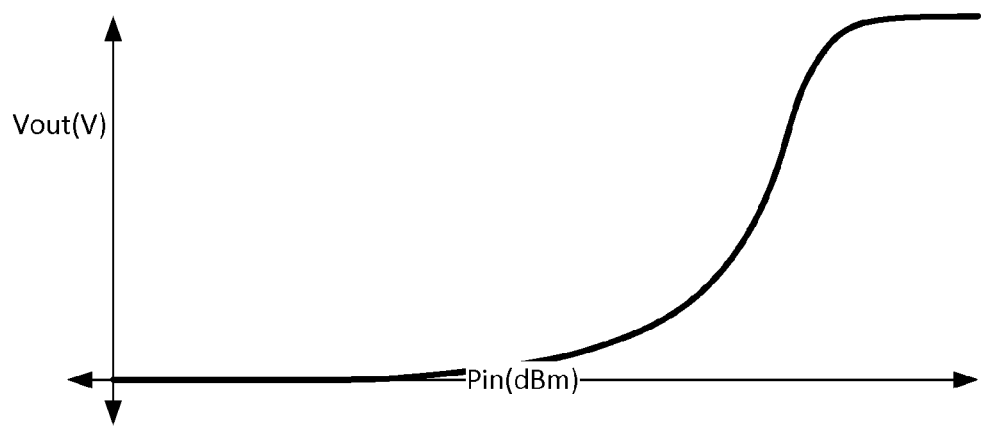
FIG. 10 illustrates an example graph demonstrating Power Detector output voltages "Vout(V)" on the Y-axis for a range of Power Detector input signal powers "Pin(dBm)" on the X-axis, in accordance with various embodiments.
Figure 11:
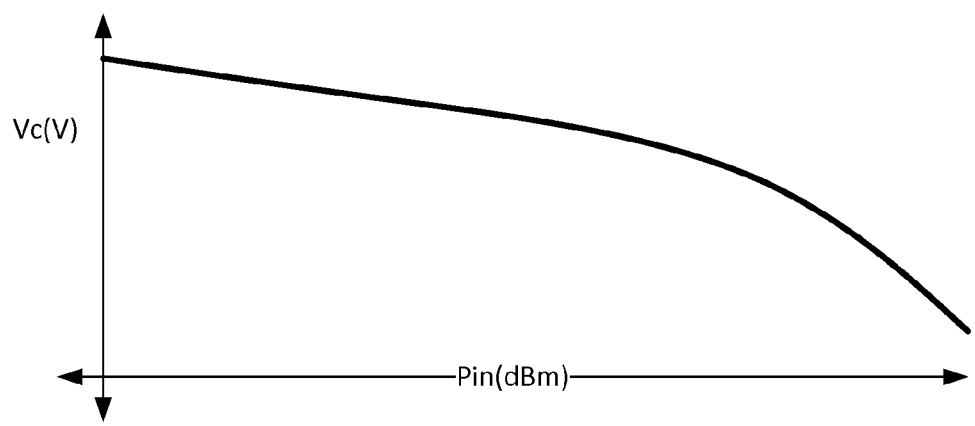
FIG. 11 illustrates an example graph of a gain control signal "Vc(V)" that can be applied to the amplifiers on the Y-axis and the Power Detector input signal power "Pin (dBm)" on the X-axis, in accordance with various embodiments.
Figure 12:
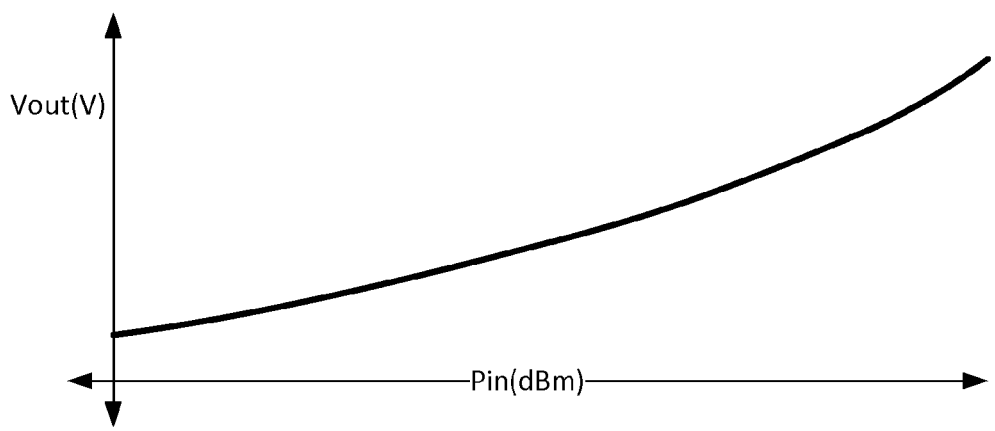
FIG. 12 illustrates an example graph demonstrating Power Detector output voltages "Vout(V)" on the Y-axis for a range of Power Detector input signal powers "Pin(dBm)" on the X-axis after implementation of a gain control system to maintain input signal power variation within the sensitivity range of the Power Detector, in accordance with various embodiments.

Due to their nature, CMOS Power Detectors can be sensitive to only a narrow power range of input signals. Accordingly, a Power Detector may not be sensitive to very large and very small input signals. FIG. 10 illustrates an example graph demonstrating Power Detector output voltages "Vout(V)" on the Y-axis for a range of Power Detector input signal powers "Pin(dBm)" on the X-axis, in accordance with various embodiments. As illustrated in the example of FIG. 10, a Power Detector may be sensitive to power variation for a narrow range of input signal powers and not sensitive to very small or very large power signals. Accordingly, a gain control system can be implemented to maintain the power of the input signal of the Power Detector within the Power Detector's sensitivity range. Such a gain control system can comprise a feedback loop that adjusts the power of the input signal to the Power Detector based on measured signal power by adjusting gain in amplifiers located before the Power Detector. A gain control signal can be generated in a gain control unit and conveyed to the amplifiers to adjust gain based on the measured signal power. For example, the RSSI described in FIG. 9 can incorporate a Gain Control Unit 916 that conveys a gain control signal to adjust the gain in amplifiers 902, 904, 906, based on the power of the signal produced in the RSSI. FIG. 11 illustrates an example graph of a gain control signal "Vc (V)" that can be applied to the amplifiers on the Y-axis and the Power Detector input signal power "Pin(dBm)" on the X-axis, in accordance with various embodiments. Hence, the feedback loop can be designed such that higher voltage gain is applied for lower power input signals and lower voltage gain is applied for higher power input signals such that input signal power variation remains in the sensitivity range of the Power Detector, FIG. 12 illustrates an example graph demonstrating Power Detector output voltages "Vout(V)" on the Y-axis for a range of Power Detector input signal powers "Pin(dBm)" on the X-axis after implementation of a gain control system to maintain input signal power variation in the sensitivity range of the Power Detector, in accordance with various embodiments. Accordingly, with such a system, the RSSI can be sensitive to a wide range of input signal powers.

The various embodiments of the invention may also involve a number of functions to be performed by a computer processor, such as a microprocessor. The microprocessor may be a specialized or dedicated microprocessor that is configured to perform particular tasks according to the embodiments by executing machine-readable software code that defines the particular tasks described herein. The microprocessor may also be configured to operate and communicate with other devices such as direct memory access modules, memory storage devices, Internet related hardware, and other devices that relate to the transmission of data in accordance with the embodiments of the invention. The software code may be configured using software formats such as Java, C++, XML (Extensible Mark-up Language) and other languages that may be used to define functions that relate to operations of devices required to carry out the functional operations related to the embodiments of the invention. The code may be written in different forms and styles, many of which are known to those skilled in the art. Different code formats, code configurations, styles, and forms of software programs and other means of configuring code to define the operations of a microprocessor in accordance with the embodiments of the invention will not depart from the spirit and scope of the invention.

Within the different types of devices, such as computers, mobile devices, laptops, cell phones. PDAs, mobile televisions, personal navigation devices, personal media players, Smartphones, or other devices that can utilize the embodiments of the invention, there can exist different types of memory components for storing and retrieving information while performing functions according to the embodiments. Cache memory devices can be included in such devices for use by a central processing unit as a convenient storage location for information that is frequently stored and retrieved. Similarly, a persistent memory can be used with such devices for maintaining information that is frequently retrieved by the central processing unit, but that is not often altered within the persistent memory, unlike the cache memory. Main memory can also be included fir storing and retrieving larger amounts of information such as data and software applications configured to perform functions according to the various embodiments when executed by the central processing unit. These memory devices may be configured as random access memory (RAM), static random access memory (SRAM), dynamic random access memory (DRAM), flash memory, and other memory storage devices that may be accessed by a central processing unit to store and retrieve information. During data storage and retrieval operations, these memory devices are transformed to have different states, such as different electrical charges, different magnetic polarity, and the like. Thus, systems and methods configured according to the embodiments of the invention as described herein enable the physical transformation of these memory devices. Accordingly, the embodiments described herein are directed to novel and useful systems and methods that, in one or more embodiments, are able to transform the memory device into a different state. The invention is not limited to any particular type of memory device, or any commonly used protocol for storing and retrieving information to and from these memory devices, respectively.

Further, within the different types of devices, such as computers, laptops, cell phones, PDAs, mobile televisions, personal navigation devices, personal media players or other devices that utilize the embodiments of the invention, there can exist different types of interface components for conveying and displaying information while performing functions described herein. Visual displays such as LCDs and audio devices such as sPowerers can be included in such devices to display information contained in a received signal in audio and/or visual format while performing functions of the various embodiments. During operation, these components are transformed into different states to display various graphical images or to vibrate at various frequencies in order to convey images and sounds to the user. Thus, systems and methods configured according to the embodiments described herein can enable the physical transformation of these interface components. Further, systems and methods configured according to the embodiments of the invention can enable the transformation of a machine-readable medium, such as a carrier signal, into a different state, such as an image or a sound wave. Accordingly, the novel and useful systems and methods described herein allow, in one or more embodiments, transformation of the interface components into a different state and transformation of a received signal into a different state. The invention is not limited to any particular type of interface component or received signal, or any commonly used protocol for applying such components and signals.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those ordinarily skilled in the art. Accordingly, the specification and drawings are to be regarded in an illustrative rather than a restrictive sense.

Reference in the specification to "an embodiment," "one embodiment," "some embodiments," "various embodiments" or "other embodiments" means that a particular feature, structure, or characteristic described in connection with the embodiments is included in at least some embodiments, but not necessarily all embodiments. References to "an embodiment," "one embodiment," or "some embodiments" are not necessarily all referring to the same embodiments. If the specification states a component, feature, structure, or characteristic "may," "can," "might," or "could" be included, that particular component, feature, structure, or characteristic is not required to be included. If the specification or Claim refers to "a" or "an" element, that does not mean there is only one of the element. If the specification or Claims refer to an "additional" element, that does not preclude there being more than one of the additional element.

The invention claimed is:

1. A system comprising a common gate common source low-noise am lifter (LNA), the common gate common source LNA further comprising:
   a radio frequency (RF) input;
   a common gate transistor;
   a variable resistor in the drain of the common gate transistor;
   a common source transistor;
   a variable resistor in the drain of the common source transistor;
   a variable resistor in the source of the common gate transistor;
   a variable resistor in the source of the common source transistor; and
   a Smart Gain Control configured to change the resistance in the variable resistor in the drain of the common gate transistor, the variable resistor in the drain of the common source transistor, the variable resistor in the source of the common gate transistor, the variable resistor in the source of the common source transistor, and the variable resistor in the RF input based on a control signal conveyed to the Smart Gain Control.

2. The system of claim 1, wherein the Smart Gain Control is further configured to change a level of gain of the common gate common source LNA based on the control signal.

3. The system of claim 1, wherein the Smart Gain Control is further configured to increase the gain of the common gate common source LNA by performing at least one of:
increasing the resistance of the variable resistor in the drain of the common source transistor and increasing the resistance of the variable resistor in the drain of the common gate transistor; and
decreasing the resistance of the variable resistor in the source of the common gate transistor and decreasing the resistance of the variable resistor in the source of the common source transistor.

4. The system of claim 1, wherein the Smart Gain Control is further configured to change the resistance of the variable resistor in the RF input to match input impedance of the common gate common source LNA.

5. The system of claim 1, wherein the Smart Gain Control is further configured to increase the resistance of the variable resistor in the RF input when the Smart Gain Control decreases the resistance of the variable resistor in the source of the common gate transistor.

6. The system of claim 1, further comprising:
a variable resistor in the RF input.

7. A method comprising:
varying a resistance level of a variable resistor in the drain of a common gate transistor of a common gate common source low-noise amplifier (LNA);
varying a resistance level of a variable resistor in the drain of a common source transistor of the common gate common source LNA;
varying a resistance level of a variable resistor in the source of the common gate transistor of the common gate common source LNA; and
varying a resistance level of a variable resistor in the source of the common source transistor of the common gate common source LNA;
wherein the resistance of the variable resistors is varied based on a control signal.

8. The method of claim 7, wherein the resistance of the variable resistors is varied based on the control signal to perform change a level of gain in the common gate common source LNA.

9. The method of claim 8, further comprising increasing the resistance of the variable resistor in the RF input when decreasing the resistance of the variable resistor in the source of the common gate transistor.

10. The method of claim 7, further comprising:
varying a resistance level of a variable resistor in an RF input of the common gate common source LNA.

11. A method comprising
varying a resistance level of a variable resistor in the drain of a common gate transistor of a common gate common source low-noise amplifier (LNA);
varying a resistance level of a variable resistor in the drain of a common source transistor of the common gate common source LNA;
varying a resistance level of a variable resistor in the source of the common gate transistor of the common gate common source LNA;
varying a resistance level of a variable resistor in the source of the common source transistor of the common gate common source LNA;
varying a resistance level of a variable resistor in an RF input of the common gate common source LNA; and
varying the resistance level of the variable resistor in the RF input of the common gate common source LNA to match an input impedance in the common gate common source LNA.

12. A method, comprising:
varying a resistance level of a variable resistor in the drain of a common gate transistor of a common gate common source low-noise amplifier (LNA);
varying a resistance level of a variable resistor in the drain of a common source transistor of the common gate common source LNA;
varying a resistance level of a variable resistor in the source of the common gate transistor of the common gate common source LNA; and
varying a resistance level of a variable resistor in the source of the common source transistor of the common gate common source LNA;
wherein the gain of the common gate common source LNA is increased by performing at least one of:
increasing the resistance of the variable resistor in the drain of the common source transistor and increasing the resistance of the variable resistor in the drain of the common gate transistor; and
decreasing the resistance of the variable resistor in the source of the common gate transistor and decreasing the resistance of the variable resistor in the source of the common source transistor.

* * * * *

UNITED STATES PATENT AND TRADEMARK OFFICE
CERTIFICATE OF CORRECTION

PATENT NO. : 8,576,008 B2
APPLICATION NO. : 13/293504
DATED : November 5, 2013
INVENTOR(S) : Saeid Mehrmanesh et al.

Page 1 of 1

It is certified that error appears in the above-identified patent and that said Letters Patent is hereby corrected as shown below:

In the Claims:

Claim 8, column 12, line 47 delete "am lifter"

and insert -- amplifier --

Signed and Sealed this
Seventeenth Day of June, 2014

Michelle K. Lee
*Deputy Director of the United States Patent and Trademark Office*